United States Patent
Lu et al.

(10) Patent No.: US 10,294,147 B2
(45) Date of Patent: *May 21, 2019

(54) HEAT TREATABLE COATED ARTICLE HAVING TITANIUM NITRIDE BASED IR REFLECTING LAYER(S)

(71) Applicant: Guardian Glass, LLC, Auburn Hills, MI (US)

(72) Inventors: Yiwei Lu, Ann Arbor, MI (US); Philip J. Lingle, Temperance, MI (US); Patricia Tucker, Lambertville, MI (US)

(73) Assignee: Guardian Glass, LLC, Auburn Hills, MI (US)

( * ) Notice: Subject to any disclaimer, the term of this patent is extended or adjusted under 35 U.S.C. 154(b) by 44 days.

This patent is subject to a terminal disclaimer.

(21) Appl. No.: 15/398,913

(22) Filed: Jan. 5, 2017

(65) Prior Publication Data
US 2018/0186691 A1   Jul. 5, 2018

(51) Int. Cl.
| | |
|---|---|
| B32B 15/04 | (2006.01) |
| B32B 17/06 | (2006.01) |
| C03C 17/22 | (2006.01) |
| C23C 14/34 | (2006.01) |
| C23C 14/06 | (2006.01) |
| C03C 17/34 | (2006.01) |
| C03B 27/012 | (2006.01) |

(52) U.S. Cl.
CPC .......... *C03C 17/225* (2013.01); *C03B 27/012* (2013.01); *C03C 17/3435* (2013.01); *C23C 14/0652* (2013.01); *C23C 14/3464* (2013.01); *C03C 2218/154* (2013.01)

(58) Field of Classification Search
USPC ......................................................... 428/426
See application file for complete search history.

(56) References Cited

U.S. PATENT DOCUMENTS

| | | | |
|---|---|---|---|
| 5,216,542 | A | 6/1993 | Szczyrbowski et al. |
| 5,948,538 | A * | 9/1999 | Brochot ................. C03C 17/36 |
| | | | 359/359 |
| 6,159,607 | A | 12/2000 | Hartig et al. |
| 6,188,512 | B1 | 2/2001 | Woodard et al. |
| 6,749,941 | B2 | 6/2004 | Lingle |
| 6,890,659 | B2 | 5/2005 | Stachowiak |
| 6,926,967 | B2 | 8/2005 | Neuman et al. |
| 6,994,910 | B2 | 2/2006 | Stachowiak |
| 7,037,587 | B2 | 5/2006 | Lin |
| 7,081,301 | B2 | 7/2006 | Stachowiak |
| 8,286,395 | B2 | 10/2012 | Mauvernay et al. |

(Continued)

FOREIGN PATENT DOCUMENTS

| | | |
|---|---|---|
| DE | 10-2014-114330 | 4/2016 |
| JP | 63-206333 | 8/1988 |

OTHER PUBLICATIONS

Machorro et al., Modification of Refractive Index in Silicon Oxynitride Films During Deposition:, Material Letters pp. 47-50, vol. 45, No. 1, Aug. 1, 2000.

*Primary Examiner* — Lauren R Colgan
(74) *Attorney, Agent, or Firm* — Nixon & Vanderhye P.C.

(57) ABSTRACT

Coated articles include at least one functional infrared (IR) reflecting layer(s) sandwiched between at least dielectric layers. The dielectric layers may be of or including silicon nitride or the like. At least one of the IR reflecting layers is of or including titanium nitride (e.g., TiN).

38 Claims, 1 Drawing Sheet

(56) References Cited

U.S. PATENT DOCUMENTS

| | | | |
|---|---|---|---|
| 2002/0192473 A1* | 12/2002 | Gentilhomme | C03C 17/3435 428/432 |
| 2003/0203215 A1 | 10/2003 | Shimatani et al. | |
| 2004/0023125 A1 | 2/2004 | Nozawa et al. | |
| 2007/0056961 A1 | 3/2007 | Shimatani et al. | |
| 2011/0146172 A1* | 6/2011 | Mauvernay | C03C 17/3435 52/235 |
| 2011/0262726 A1* | 10/2011 | Knoll | C03C 17/36 428/213 |
| 2012/0177899 A1* | 7/2012 | Unquera | C03C 17/36 428/213 |

* cited by examiner

HEAT TREATABLE COATED ARTICLE HAVING TITANIUM NITRIDE BASED IR REFLECTING LAYER(S)

This invention relates to coated articles that include at least one (e.g., two or more) functional infrared (IR) reflecting layer(s) sandwiched between at least dielectric layers, and/or a method of making the same. In example embodiments, at least one of the IR reflecting layers is of or including titanium nitride (e.g., TiN). The coating may be designed so that the coated articles realize one or more of: desirable glass side and/or film side reflective visible coloration which in certain example embodiments is not too red; a desirably low solar heat gain coefficient (SHGC); desirable visible transmission (TY or $T_{vis}$); thermal stability upon optional heat treatment (HT) such as thermal tempering; desirably low normal emittance ($E_n$); and/or desirably high light-to-solar gain ratio (LSG). Such coated articles may be used in the context of monolithic windows, insulating glass (IG) window units, laminated windows, and/or other suitable applications.

BACKGROUND AND SUMMARY OF THE INVENTION

Low solar factor (SF) and solar heat gain coefficient (SHGC) values are desired in some window applications, particularly in warm weather climates. Solar factor (SF), calculated in accordance with EN standard 410, relates to a ratio between the total energy entering a room or the like through a glazing and the incident solar energy. Thus, it will be appreciated that lower SF values are indicative of good solar protection against undesirable heating of rooms or the like protected by windows/glazings. A low SF value is indicative of a coated article (e.g., IG window unit) that is capable of keeping a room fairly cool in summertime months during hot ambient conditions. Thus, low SF values are sometimes desirable in hot environments. High light-to-solar gain (LSG) values are also desirable. LSG is calculated as $T_{vis}$/SHGC. The higher the LSG value, the more visible light that is transmitted and the less amount of heat that is transmitted by the coated article. While low SF and SHGC values, and high LSG values, are sometimes desirable for coated articles such as IG window units and/or monolithic windows, the achievement of such values may come at the expense of sacrificing coloration and/or reflectivity values. In particular, conventional attempts to achieve low SF and SHGC values have often resulted in undesirably high visible reflectance value(s) and/or undesirable visible coloration of the coating. Thus, conventional low-E coatings designed for monolithic window applications typically cannot be used to provide low visible transmission (e.g., 15-36%), low SHGC performance absent the use of deeply tinted glass substrates. It is often desirable, but difficult, to achieve a combination of acceptable visible transmission (TY or $T_{vis}$), desirable reflective coloration (e.g., desirable a* and b* reflective color values), low SF, low SHGC, and high LSG for a coated article in window applications, especially if it desired to use a glass substrate that is not deeply tinted.

SF (G-Factor; EN410-673 2011) and SHGC (NFRC-2001) values are calculated from the full spectrum ($T_{vis}$, Rg and Rf) and are typically measured with a spectrophotometer such as a Perkin Elmer 1050. The SF measurements are done on monolithic coated glass, and the calculated values can be applied to monolithic, IG and laminated applications.

Certain known solar control coatings use NbN, NbZr, or NbZrN as IR reflecting layers. For instance, see U.S. Patent Document 2012/0177899 and U.S. Pat. No. 8,286,395. However, the instant inventors have surprisingly found that solar control coatings that use solely these materials NbN, NbZr, or NbZrN for IR reflecting layers are lacking in terms of normal emissivity ($E_n$) for a given IR reflecting layer(s) thickness. For a given IR reflecting layer(s) thickness, the instant inventors have found that such coatings have undesirably high normal emittance ($E_n$) values, undesirably high SHGC values; and undesirably low LSG values.

Solar control coatings in U.S. Patent Document 2012/0177899 (incorporated herein by reference) are disclosed having a layer stack of glass/$Si_3N_4$/NiCr/$Si_3N_4$/NiCr/$Si_3N_4$ where the NiCr layer may be nitrided. While layer stacks of U.S. Patent Document 2012/0177899 provide reasonable solar control and are overall good coatings, they are lacking in certain respects. For instance, the glass side visible reflectance values ($R_GY$) in Examples 1, 4 and 5 are 36%, 36.87%, and 15.82%, respectively. Examples 1 and 4 in US '899 are undesirable because the glass side visible reflectance ($R_GY$) values are too high at 36% and 36.87%, respectively, and because the glass side reflective a* values are too negative at -17.8 and -15.95, respectively. And when $R_GY$ is reduced down to 15.82% in Example 5, this results in the glass side reflective a* color value in Example 5 becoming rather red with a value of +2.22. While certain example embodiments of the instant invention may have red reflective coloration in certain instances, other example embodiments of this invention have been designed to achieve a combination of desirable visible reflectance values and coloration which is either not red or not too red.

It would be desirable according to example embodiments of this invention for a coating to be designed so as to have a combination of acceptable visible transmission (TY or $T_{vis}$), desirable reflective coloration (e.g., desirable a* and b* reflective color values), low SF, low SHGC, and high LSG for a coated article in window applications. Note that as visible transmission increases parameters such as SF and SHGC may also increase, and $E_n$ may decrease, with this being based on the desired transmission for instance of a given coated article for a given application. Coated articles according to certain example embodiments of this invention substantially reduce the red reflective color while retaining a low visible reflectance, while maintaining good mechanical, chemical and environmental durability and low emissivity properties.

In certain example embodiments of this invention, certain applications such as monolithic window applications desire reflective coloration that is not significantly red. In other words, certain applications such as monolithic window applications desire reflective a* color values that are either negative or no greater than +1.6 or +1.0 (glass side and/or film side reflective a* values higher than +1.6 are often considered too red). Such reflective a* values are desirable in the context of glass side reflective ($R_{G[or\ outside,\ or\ exterior]}$Y) and/or film side reflective ($R_{F[or\ inside]}$Y) a* values.

Certain embodiments of this invention relate to coated articles that include two or more functional infrared (IR) reflecting layers sandwiched between at least dielectric layers, and/or a method of making the same. The dielectric layers may be of or include silicon nitride or the like. In certain example embodiments, the IR reflecting layers are of or include titanium nitride (e.g., TiN). It has surprisingly and unexpectedly been found that the use of titanium nitride for the IR reflecting layers in a given solar control coating surprisingly results in improved emittance, SHGC and/or LSG values, and may be designed to surprisingly improve reflective a* values which are often desirable characteristics in window applications. Coatings according to embodiments of this invention may be designed so that before and/or after any optional heat treatment such as thermal tempering the coated articles realize one or more of: desirable glass side and/or film side reflective visible coloration that is not too red; a desirably low solar heat gain coefficient (SHGC); desirable visible transmission (TY or $T_{vis}$); thermal stability upon optional heat treatment (HT) such as thermal tempering; desirably low normal emissivity/emittance ($E_n$); and/or desirably high light-to-solar gain ratio (LSG). Such coated articles may be used in the context of monolithic windows, insulating glass (IG) window units, laminated windows, and/or other suitable applications for architectural or vehicle purposes.

In an example embodiment of this invention, there is provided a coated article including a coating supported by a glass substrate, the coating comprising: a first dielectric layer comprising silicon nitride; a first infrared (IR) reflecting layer comprising a nitride of titanium on the glass substrate over at least the first dielectric layer comprising silicon nitride; a second dielectric layer comprising silicon nitride on the glass substrate over at least the first dielectric layer comprising silicon nitride and the first IR reflecting layer comprising the nitride of titanium; a second layer IR reflecting layer comprising a nitride of titanium on the glass substrate over at least the second dielectric layer comprising silicon nitride; a third dielectric layer comprising silicon nitride on the glass substrate over at least the second IR reflecting layer comprising the nitride of titanium; wherein the coating contains no IR reflecting layer based on silver; and wherein the coated article measured monolithically has: a visible transmission from about 12-70%, a glass side visible reflectance no greater than about 16%, and a glass side reflective a* value of from −10 to +1.6.

In an example embodiment of this invention, there is provided a coated article including a coating supported by a glass substrate, the coating comprising: a first dielectric layer; a first infrared (IR) reflecting layer comprising a nitride of titanium on the glass substrate over at least the first dielectric layer; a second dielectric layer comprising silicon nitride on the glass substrate over at least the first dielectric layer and the first IR reflecting layer comprising the nitride of titanium; a second layer IR reflecting layer comprising a nitride of titanium on the glass substrate over at least the second dielectric layer comprising silicon nitride; a third dielectric layer on the glass substrate over at least the second IR reflecting layer comprising the nitride of titanium; wherein the coating contains no IR reflecting layer based on silver; and wherein the coated article measured monolithically has: a visible transmission from about 12-70%, a glass side visible reflectance no greater than about 16%, and a glass side reflective a* value of from −10 to +1.6.

In an example embodiment of this invention, there is provided a coated article including a coating supported by a glass substrate, the coating comprising: a first dielectric layer comprising silicon nitride; a first infrared (IR) reflecting layer comprising a nitride of titanium on the glass substrate over at least the first dielectric layer comprising silicon nitride; a second dielectric layer comprising silicon nitride on the glass substrate over at least the first dielectric layer comprising silicon nitride and the first IR reflecting layer comprising the nitride of titanium; a second layer IR reflecting layer comprising a nitride of titanium on the glass substrate over at least the second dielectric layer comprising silicon nitride; a third dielectric layer comprising silicon nitride on the glass substrate over at least the second IR reflecting layer comprising the nitride of titanium; wherein the coating contains no IR reflecting layer based on silver; and wherein the coated article measured monolithically has a visible transmission from about 12-70% and one or more of: (a) a glass side visible reflectance no greater than about 16%, (b) a glass side reflective a* value of from −10 to +1.6, (c) a film side visible reflectance no greater than about 16%, and (d) a film side reflective a* color value of from −8 to +1.6.

In certain example embodiments of this invention, there is provided a coated article including a coating supported by a glass substrate, the coating comprising: a first dielectric layer comprising silicon nitride; a first infrared (IR) reflecting layer comprising a nitride of titanium on the glass substrate over at least the first dielectric layer comprising silicon nitride; a second dielectric layer comprising silicon nitride on the glass substrate over at least the first dielectric layer comprising silicon nitride and the first IR reflecting layer comprising the nitride of titanium; wherein the coating contains no IR reflecting layer based on silver; and wherein the coated article measured monolithically has: a visible transmission from about 12-70%, an LSG of at least 1.00, and a glass side reflective a* value of from −10 to +1.6.

Thus, this invention covers monolithic window units, IG window units, laminated window units, and any other article including a glass substrate having a coating thereon as claimed. Note that monolithic measurements may be taken by removing a coated substrate from an IG window unit and/or laminated window unit, and then performing monolithic measurements. It is also noted that for a given coating the SF and SHGC values will be significantly higher for a monolithic window unit than for an IG window unit with the same coated article.

DETAILED DESCRIPTION OF CERTAIN EXAMPLE EMBODIMENTS OF THE INVENTION

Referring now more particularly to the accompanying drawings in which like reference numerals indicate like parts throughout the several views.

Figure 1:
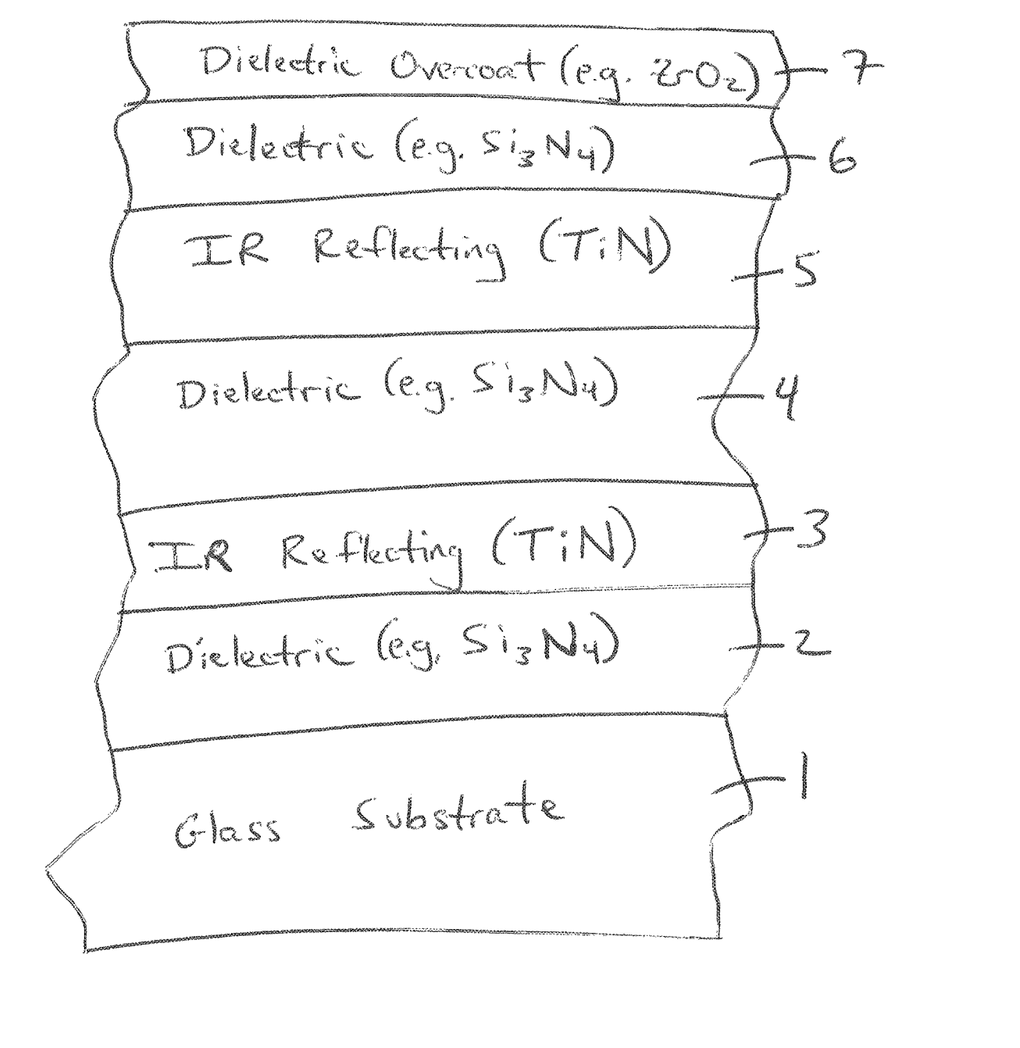
FIG. 1 is a partial cross sectional view of a monolithic coated article (heat treated or not heat treated) according to an example embodiment of this invention.

A coating 8 is designed so as to have a combination of acceptable visible transmission (TY or $T_{vis}$), desirable reflective coloration (e.g., desirable a* and b* reflective color values), low SF, low SHGC, and high LSG for a coated article for use in window applications or the like.

Certain embodiments of this invention relate to coated articles having a coating 9 on a glass substrate 1, where the coating includes two or more functional infrared (IR) reflecting layers 3 and 5 sandwiched between at least dielectric layers 2, 4, 6, 7, and/or a method of making the same. The dielectric layers 2, 4 and 6 may be of or include silicon nitride or the like. Transparent dielectric overcoat 7, of or including zirconium oxide or any other suitable material, is optional. In certain example embodiments, the IR reflecting layers 3 and 5 are of or including titanium nitride (e.g., TiN). It has surprisingly and unexpectedly been found that the use of titanium nitride for the IR reflecting layers 3 and 5 in a given solar control coating surprisingly results in improved emittance, SHGC and/or LSG values, and may be designed to surprisingly improve reflective a* values which are often desirable characteristics in window applications.

Coatings according to embodiments of this invention may be designed so that before and/or after any optional heat treatment such as thermal tempering the coated articles realize one or more of: desirable glass side and/or film side reflective visible coloration that is not too red; a desirably low solar heat gain coefficient (SHGC); desirable visible transmission (TY or $T_{vis}$); thermal stability upon optional heat treatment (HT) such as thermal tempering; desirably low normal emissivity/emittance ($E_n$); and/or desirably high light-to-solar gain ratio (LSG). Such coated articles may be used in the context of monolithic windows, insulating glass (IG) window units, laminated windows, and/or other suitable applications for architectural or vehicle purposes.

Coated articles may optionally be heat treated in certain example embodiments of this invention, and are preferably designed to be heat treatable. The terms "heat treatment" and "heat treating" as used herein mean heating the article to a temperature sufficient to achieve thermal tempering, heat bending, and/or heat strengthening of the glass inclusive article. This definition includes, for example, heating a coated article in an oven or furnace at a temperature of least about 580 degrees C., more preferably at least about 600 degrees C. (e.g., about 650 degrees C.), for a sufficient period to allow tempering, bending, and/or heat strengthening. In certain instances, the HT may be for at least about 4 or 5 minutes. The coated article may or may not be heat treated in different embodiments of this invention.

FIG. 1 is a cross sectional view of a coated article according to an example embodiment of this invention. In the FIG. 1 embodiment the solar control coating 8 includes two IR reflecting layers 3 and 5, and transparent dielectric layers 2, 4, 6 and 7. The coated article includes at least glass substrate 1 (e.g., clear, green, bronze, grey, blue, or blue-green glass substrate from about 1.0 to 12.0 mm thick, more preferably from 4-8 mm thick, with an example glass substrate thickness being 6 mm), transparent dielectric layers 2, 4, 6 (e.g., of or including silicon nitride [e.g., $Si_3N_4$], silicon oxynitride, silicon zirconium nitride, or some other suitable dielectric), and IR reflecting layers 3, 5. It will be appreciated that the IR reflecting layers 3 and/or 5 may be nitrided in certain example embodiments of this invention. The IR reflecting layers 3 and 5 are of or include titanium nitride (e.g., TiN, preferably a stoichiometric or substantially stoichiometric type). The IR reflecting layers 3 and 5 are of or include $TiN_x$ in certain example embodiments of this invention, where x is preferably from 0.8 to 1.2, more preferably from 0.9 to 1.1, with an example value being about 1.0. These "x" values provide for improved/lowered emittance values compared to if "x" is too low for instance. While the IR reflecting layers 3 and 5 may include some small amount of oxygen in certain instances, it is preferable that these layers 3 and 5 are substantially free of oxygen such as no more than 8% oxygen, more preferably no more than about 5% oxygen, and most preferably no more than about 3% or 2% oxygen in certain embodiments (atomic %). The coated article may optionally include transparent dielectric overcoat layer 7 of or including a protective material such as zirconium oxide (e.g., $ZrO_2$) or silicon oxynitride. Optionally, a dielectric layer of or including silicon oxynitride and/or zirconium silicon oxynitride of any suitable stoichiometry may be located between and contacting layers 6 and 7 in the upper part of the layer stack in certain example embodiments. In certain example embodiments of this invention, coating 8 does not include any metallic IR blocking or reflecting layer of or based on Ag or Au. In certain example embodiments of this invention, IR reflecting layers 3 and 5 reflect at least some IR radiation, and do not contact any other metal or metal based IR reflecting layer. In certain example embodiments, it is possible for each of the layers to include other materials such as dopants. It will be appreciated of course that other layers may also be provided, or certain layers may be omitted, and different materials may be used, in certain alternative embodiments of this invention. Note that layers 5-6 may be omitted in certain alternative embodiments of this invention, so as to provide for coatings have just one IR reflecting layer 3.

The overall coating 8 of FIG. 1 includes at least the illustrated layers in certain example embodiments, with layer 7 in particular being optional. It is noted that the terms "oxide" and "nitride" as used herein include various stoichiometries. For example, the term silicon nitride (for one or more of layers 2, 4, 6) includes stoichiometric $Si_3N_4$, as well as non-stoichiometric silicon nitride, and these layers may be doped with other material(s) such as Al and/or O. The illustrated layers may be deposited on glass substrate 1 via magnetron sputtering, any other type of sputtering, or via any other suitable technique in different embodiments of this invention. It is noted that other layer(s) may be provided in the stack shown in FIG. 1 such as between layers 2 and 3, or between layers 3 and 4, or between the substrate 1 and layer 2, or the like. Generally, other layer(s) may also be provided in other locations of the coating. Thus, while the coating 8 or layers thereof is/are "on" or "supported by" substrate 1 (directly or indirectly), other layer(s) may be provided therebetween. Thus, for example, the layer system 8 and layers thereof shown in FIG. 1 are considered "on" the substrate 1 even when other layer(s) may be provided therebetween (i.e., the terms "on" and "supported by" as used herein are not limited to directly contacting). However, there may be the direct contacts shown in FIG. 1 in preferred embodiments.

In certain example embodiments of this invention, dielectric layers 2, 4, and 6 may each have an index of refraction "n" of from 1.7 to 2.7 (at 550 nm), more preferably from 1.9 to 2.5 in certain embodiments, and most preferably from about 2.0 to 2.06 in preferred embodiments of this invention. One, two, three, or all of these layers 2, 4, 6 may be of or include silicon nitride and/or silicon oxynitride in certain example embodiments of this invention. In such embodiments of this invention where layers 2, 4, 6 comprise silicon nitride (e.g., $Si_3N_4$), sputtering targets including Si employed to form these layers may or may not be admixed with up to 1-20% (e.g., 8%) by weight aluminum or stainless steel (e.g. SS#316), with about this amount then appearing in the layers so formed. Even with this amount(s) of aluminum and/or stainless steel, such layers are still considered dielectric layers. In certain example embodiments, each of the IR reflecting layers 3 and 5 is provided between respective nitride layers (e.g., silicon nitride based layers 2, 4, 6) in order to reduce or prevent oxidation of the IR reflecting layers during possible heat treatment (e.g., thermal tempering, heat bending, and/or heat strengthening) thereby permitting predictable coloration to be achieved following the heat treatment at multiple viewing angles. While FIG. 1 illustrates a coated article according to an embodiment of this invention in monolithic form, coated articles according to other embodiments of this invention may comprise IG (insulating glass) window units or the like.

Turning back to the FIG. 1 embodiment, various thicknesses may be used consistent with one or more of the needs discussed herein. According to certain example embodiments of this invention, example thicknesses (in angstroms) and materials for the respective layers of the FIG. 1 embodiment on the glass substrate 1 are as follows in certain example embodiments for achieving desired transmission, reflective coloration, and visible reflectance in combination with a desirably low SF and/or SHGC value(s) and/or a desirably high LSG value (layers are listed in order moving away from the glass substrate 1):

TABLE 1

(Thicknesses in FIG. 1 embodiment)

| Layer | Example Range (Å) | Preferred (Å) | Example (Å) |
|---|---|---|---|
| silicon nitride (layer 2): | 20-500 Å | 150-300 Å | 220 Å |
| IR reflector (e.g., TiN) (layer 3): | 5-400 Å | 140-300 Å | 240 Å |
| silicon nitride (layer 4): | 200-1100 Å | 400-900 Å | 670 Å |
| IR reflector (e.g., TiN) (layer 5): | 50-450 Å | 200-400 Å | 310 Å |
| silicon nitride (layer 6): | 8-700 Å | 210-500 Å | 10 Å |
| overcoat (e.g., $ZrO_2$) (layer 7): | 10-150 Å | 20-50 Å | 40 Å |

Table 1 above relates to, for example, embodiments where coating 8 is designed so that before and/or after any optional heat treatment such as thermal tempering the coated articles realize one, two, three, four, five or all six of: desirable glass side and/or film side reflective visible coloration such as not too red reflective color (e.g., reflective a* color value(s) having a negative value or a small positive value no greater than +1.6); a desirably low SHGC; desirable visible transmission; thermal stability upon optional HT such as thermal tempering; desirably low $E_n$; and/or a desirably high LSG. In certain example embodiments, it has unexpectedly been found that when upper IR reflecting layer 5 is physically at least 20% thicker (more preferably at least 40% thicker) than lower IR reflecting layer 3 the film side reflective a* value can be surprisingly improved. In certain example embodiments, the upper IR reflecting layer 5 is thicker than the lower IR reflecting layer 3 by at least 50 angstroms (Å), more preferably by at least 100 Å, and sometimes by at least 150 Å. In certain example embodiments of this invention, center dielectric layer 4 is physically thicker than each of dielectric layers 2 and 6 by at least 50 angstroms (Å), more preferably by at least 100 Å, and sometimes by at least 200 Å, in order to provide for improved coloration and/or reflectance values especially in low visible transmission applications.

Before and/or after any optional heat treatment (HT) such as thermal tempering, in certain example embodiments of this invention coated articles according to the FIG. 1 embodiment have color/optical characteristics as follows in Table 2 (measured monolithically). It is noted that subscript "G" stands for glass side reflective, subscript "T" stands for transmissive, and subscript "F" stands for film side reflective. As is known in the art, glass side (G) means when viewed from the glass side (as opposed to the layer/film side) of the coated article. Film side (F) means when viewed from the side of the coated article on which the coating is provided. Table 3 set forth below illustrates certain characteristics of coated articles according to certain example embodiments of this invention after HT such as thermal tempering (monolithically measured for Table 3). The characteristics shown in Table 2 are in accordance with Illuminant C, 2 degree Observer, and are applicable to HT and non-HT coated articles herein, except that the thermal stability data in Table 3 relates to HT coated articles and demonstrates the stability upon HT.

TABLE 2

Color/Optical Characteristics (FIG. 1 embodiment monolithic)

| | General | Preferred | Most Preferred |
|---|---|---|---|
| $T_{vis}$ (TY): | 12-70% | 15-60% | 15-50% (or 15-36%) |
| $a^*_T$ | −10 to +5 | −8 to +2 | −6 to 0 |
| $b^*_T$ | −15 to +7 | −10 to +3 | −9 to 0 |
| $R_G Y$(glass side): | ≤16% | ≤14% | ≤11% (or ≤10%) |
| $a^*_G$ | −10 to +1.6 | −8 to +1.5 | −5 to +1 |
| $b^*_G$ | −27 to +9 | −12 to +4 | −9 to 0 |
| $R_F Y$(film side): | ≤30% | ≤16% | ≤14% (or ≤12%) |
| $a^*_F$ | −10 to +8 | −8 to +1.6 | −7 to +1 |
| $b^*_F$ | −20 to +9 | −14 to +4 | −12 to 0 |
| $E_n$: | ≤0.50 (or ≤0.40) | ≤0.36 | ≤0.28 (or ≤0.25; or ≤0.22) |
| SHGC: | ≤0.52 | ≤0.40 | ≤0.32 (or ≤0.25; or ≤0.24) |
| LSG: | ≥0.70 | ≥0.80 | ≥1.00 |

TABLE 3

Thermal Stability (FIG. 1 after HT; in addition to Table 2)

| | General | Preferred | Most Preferred |
|---|---|---|---|
| $\Delta E^*_G$ | <=4.0 | <=3.5 | <=3.0 |

For purposes of example only, Examples 1-8 represent different example embodiments of this invention, and are set forth below.

EXAMPLES

The layers in Examples 1-10 according to various embodiments of this invention were sputter-deposited on 4 mm thick clear glass substrates. Examples 2 and 6 were designed to have neutral coloration, and Examples 4 and 8 were designed to have blue coloration. Examples 1-8 all had little or no red coloration with respective to glass side reflective color (glass side reflective a* values from −10 to +1.6). Meanwhile, Examples 2, 4, and 6-8 also had little or no red coloration with respective to film side reflective color (film side reflective a* values from −10 to +1.6), and the changes to achieve this compared to Examples 1, 3 and 5 were unexpected and surprising. Different thicknesses of various layers in the examples are designed for different desired visible transmission applications. Examples 9-10 were coatings having only one IR reflecting layer (layers 5 and 6 in FIG. 1 were not present). The optical measurements are monolithic measurements. Optical data for Examples 1-10 is in accordance with Illuminant C, 2 degree Observer, unless indicated otherwise. The silicon nitride layers in each example were doped with about 8% Al. The TiN layers were approximately stoichiometric. Layer thicknesses are in angstroms (Å). "L" in Table 4 below stand for Layer (e.g., L2 means layer 2 shown in FIG. 1, L3 means layer 3 shown in FIG. 1, and so forth).

TABLE 4

Layer Stacks of Examples

| Example | L2($Si_3N_4$) | L3(TiN) | L4($Si_3N_4$) | L5(TiN) | L6 ($Si_3N_4$) | L7 ($ZrO_2$) |
|---|---|---|---|---|---|---|
| Ex. 1: | 220 | 240 | 670 | 310 | 10 | 40 |
| Ex. 2: | 390 | 160 | 530 | 350 | 610 | 40 |
| Ex. 3: | 140 | 200 | 590 | 240 | 30 | 40 |
| Ex. 4: | 380 | 140 | 640 | 280 | 420 | 40 |

TABLE 4-continued

Layer Stacks of Examples

| Example | L2(Si$_3$N$_4$) | L3(TiN) | L4(Si$_3$N$_4$) | L5(TiN) | L6 (Si$_3$N$_4$) | L7 (ZrO$_2$) |
|---|---|---|---|---|---|---|
| Ex. 5: | 40 | 180 | 350 | 120 | 30 | 40 |
| Ex. 6: | 50 | 100 | 480 | 150 | 10 | 40 |
| Ex. 7: | 80 | 170 | 380 | 70 | 30 | 40 |
| Ex. 8: | 380 | 80 | 700 | 210 | 410 | 40 |
| Ex. 9: | 230 | 210 | 370 | n/a | n/a | 40 |
| Ex. 10: | 230 | 210 | 370 | n/a | n/a | 40 |

Measured monolithically, annealed and before thermal tempering (HT), Examples 1-5 had the following characteristics.

TABLE 5

Optical Data (Pre-HT; Examples 1-5)

| Parameter | Ex. 1 | Ex. 2 | Ex. 3 | Ex. 4 | Ex. 5 |
|---|---|---|---|---|---|
| T$_{vis}$ (TY)(transmission): | 15.4% | 18.7% | 20.5% | 29.0% | 31.5% |
| a*$_T$ | -5.5 | -2.5 | -5.6 | -2.0 | -4.6 |
| b*$_T$ | -5.1 | -3.3 | -2.1 | -6.3 | -1.2 |
| R$_G$Y(glass side refl. %): | 10.1% | 7.6% | 9.7% | 7.9% | 14.3% |
| a*$_G$: | -0.5 | -4.2 | -0.1 | -1.1 | -1.5 |
| b*$_G$: | -5.6 | -8.2 | -0.9 | -20.7 | -2.9 |
| R$_F$Y(film side refl. %): | 26.4% | 11.5% | 20.3% | 1.0% | 12.3% |
| a*$_F$: | 4.5 | -2.6 | 4.6 | -3.5 | 4.8 |
| b*$_F$: | -9.1 | -12.6 | -6.5 | -5.0 | -1.7 |
| E$_n$: | 0.21 | — | — | — | — |
| SHGC (NFRC-2001): | 0.22 | 0.25 | 0.25 | 0.31 | 0.31 |
| LSG: | 0.72 | 0.75 | 0.84 | 0.95 | 1.01 |

Measured monolithically, after thermal tempering (HT), Examples 1-5 had the following characteristics.

TABLE 6

Optical Data (Post-HT; Examples 1-5)

| Parameter | Ex. 1 | Ex. 2 | Ex. 3 | Ex. 4 | Ex. 5 |
|---|---|---|---|---|---|
| T$_{vis}$ (TY)(transmission): | 18.6% | 21.1% | 24.2% | 33.2% | 35.3% |
| a*$_T$ | -7.2 | -2.9 | -7.0 | -2.8 | -5.5 |
| b*$_T$ | -4.3 | -4.4 | -1.5 | -5.0 | -0.8 |
| R$_G$Y(glass side refl. %): | 9.5% | 8.9% | 9.2% | 8.2% | 13.0% |
| a*$_G$: | -3.2 | -3.1 | -2.8 | -0.6 | -0.3 |
| b*$_G$: | -3.5 | -4.8 | 0.4 | -20.1 | -5.7 |
| R$_F$Y(film side refl. %): | 25.2% | 14.6% | 19.1% | 1.3% | 10.8% |
| a*$_F$: | 5.3 | -4.5 | 4.7 | -6.3 | 7.0 |
| b*$_F$: | -8.3 | -4.0 | -6.1 | -7.1 | -5.4 |
| E$_n$: | 0.18 | — | — | — | — |
| SHGC (NFRC-2001): | 0.21 | 0.24 | 0.24 | 0.31 | 0.31 |
| LSG: | 0.88 | 0.87 | 1.00 | 1.08 | 1.14 |

Measured monolithically, annealed and before thermal tempering (HT), Examples 6-10 had the following characteristics.

TABLE 7

Optical Data (Pre-HT; Examples 6-10)

| Parameter | Ex. 6 | Ex. 7 | Ex. 8 | Ex. 9 | Ex. 10 |
|---|---|---|---|---|---|
| T$_{vis}$ (TY)(transmission): | 35.8% | 40.8% | 40.7% | 52.9% | 51.6% |
| a*$_T$ | -3.9 | -3.5 | -1.2 | -2.5 | -2.6 |
| b*$_T$ | -0.2 | -0.3 | -3.0 | -2.9 | -2.6 |
| R$_G$Y(glass side refl. %): | 8.9% | 15.6% | 10.0% | 17.4% | 18.7% |
| a*$_G$: | -5.8 | -4.0 | -3.5 | -4.4 | -4.6 |
| b*$_G$: | -2.4 | -5.4 | -21.3 | -4.6 | -3.5 |

TABLE 7-continued

Optical Data (Pre-HT; Examples 6-10)

| Parameter | Ex. 6 | Ex. 7 | Ex. 8 | Ex. 9 | Ex. 10 |
|---|---|---|---|---|---|
| R$_F$Y(film side refl. %): | 19.6% | 9.3% | 2.4% | 4.9% | 6.1% |
| a*$_F$: | -0.1 | 1.2 | -5.0 | -0.3 | -0.9 |
| b*$_F$: | -1.5 | -3.6 | -8.1 | 7.5 | 7.8 |
| E$_n$: | — | — | — | 0.38 | 0.44 |
| SHGC (NFRC-2001): | 0.36 | 0.38 | 0.39 | 0.46 | 0.46 |
| LSG: | 0.99 | 1.06 | 1.04 | 1.14 | 1.11 |

Measured monolithically, after thermal tempering (HT), Examples 6-10 had the following characteristics.

TABLE 8

Optical Data (Post-HT; Examples 6-10)

| Parameter | Ex. 6 | Ex. 7 | Ex. 8 | Ex. 9 | Ex. 10 |
|---|---|---|---|---|---|
| T$_{vis}$ (TY)(transmission): | 39.8% | 44.8% | 45.2% | 56.6% | 56.3 |
| a*$_T$ | -4.4 | -3.9 | -1.7 | -2.6 | -3.0 |
| b*$_T$ | 0.4 | 0.5 | -1.3 | -1.8 | -1.4 |
| R$_G$Y(glass side refl. %): | 8.4% | 14.2% | 9.8% | 15.7% | 15.7 |
| a*$_G$: | -7.6 | -4.1 | -3.1 | -4.4 | -3.7 |
| b*$_G$: | -5.1 | -8.3 | -21.6 | -6.6 | -8.3 |
| R$_F$Y(film side refl. %): | 18.4% | 8.1% | 2.4% | 4.0% | 5.2% |
| a*$_F$: | -0.5 | 1.1 | -5.6 | -1.2 | -1.7 |
| b*$_F$: | -2.8 | -8.5 | -12.8 | 0.2 | -0.4 |
| E$_n$: | — | — | — | 0.33- | 0.39 |
| SHGC (NFRC-2001): | 0.36 | 0.38 | 0.40 | 0.47 | 0.48 |
| LSG: | 1.10 | 1.17 | 1.13 | 1.21 | 1.18 |

Each of Examples 1-8 were according to various example embodiments of this invention. As explained above, Examples 1-8 all had desirable visible transmission, low glass side visible reflectance, desirably low SHGC, desirably high LSG, and little or no red coloration with respective to glass side reflective color (glass side reflective a* values from -10 to +1.6). Meanwhile, Examples 2, 4, 6 and 8 also had little or no red coloration with respective to film side reflective color (film side reflective a* values from -10 to +1.6), and the changes to achieve this compared to Examples 1, 3 and 5 were unexpected and surprising. It can be seen that in Examples 2, 4, 6 and 8 the change in the thickness ratio or thickness values between the first and second IR reflecting layers 3 and 5 unexpectedly resulted in a shift of film side reflective a* color values toward the neutral to reduce or remove red film side reflective color (compared to Examples 1, 3 and 5). Thus, in certain example embodiments, it has unexpectedly been found that when upper IR reflecting layer 5 is physically at least 20% thicker (more preferably at least 40% thicker) than lower IR reflecting layer 3 the film side reflective a* value can be surprisingly improved/reduced. In certain example embodiments, the upper IR reflecting layer 5 is thicker than the lower IR reflecting layer 3 by at least 50 angstroms (Å), more preferably by at least 100 Å, and sometimes by at least 150 Å.

Examples 9-10 were single IR reflecting layer coatings. Such embodiments are preferred when a visible transmission of 40-60% is desired. When visible transmission less than 40% is desired, double IR reflecting layer coatings as in FIG. 1 are desired so as to avoid high and reddish reflective color.

In an example embodiment of this invention, there is provided a coated article including a coating supported by a glass substrate, the coating comprising: a first dielectric layer comprising silicon nitride; a first infrared (IR) reflecting layer comprising a nitride of titanium on the glass substrate over at least the first dielectric layer comprising silicon nitride; a second dielectric layer comprising silicon nitride on the glass substrate over at least the first dielectric layer comprising silicon nitride and the first IR reflecting layer comprising the nitride of titanium; a second layer IR reflecting layer comprising a nitride of titanium on the glass substrate over at least the second dielectric layer comprising silicon nitride; a third dielectric layer comprising silicon nitride on the glass substrate over at least the second IR reflecting layer comprising the nitride of titanium; wherein the coating contains no IR reflecting layer based on silver; and wherein the coated article measured monolithically has: a visible transmission from about 12-70%, a glass side visible reflectance no greater than about 16%, and a glass side reflective a* value of from −10 to +1.6.

In the coated article of the immediately preceding paragraph, the coating in certain embodiments contains only two IR reflecting layers.

In the coated article of any of the preceding two paragraphs, the second dielectric layer comprising silicon nitride may be located between and directly contacting the first and second IR reflecting layers.

In the coated article of any of the preceding three paragraphs, the second IR reflecting layer comprising the nitride of titanium may comprise $TiN_x$, where x is from 0.8 to 1.2, more preferably from 0.9 to 1.1.

In the coated article of any of the preceding four paragraphs, one or both of the first and second IR reflecting layers may comprise $TiN_x$, where x is from 0.8 to 1.2, more preferably from 0.9 to 1.1.

In the coated article of any of the preceding five paragraphs, one or both of the first and second IR reflecting layers may contain from 0-8% oxygen (atomic %), more preferably from 0-5% oxygen (atomic %), and most preferably from 0-3% oxygen (atomic %).

In the coated article of any of the preceding six paragraphs, the coated article measured monolithically may have a film side visible reflectance no greater than about 16%.

In the coated article of any of the preceding seven paragraphs, measured monolithically the coated article may have a film side reflective a* color value of from −8 to +1.6.

In the coated article of any of the preceding eight paragraphs, the second IR reflecting layer may be at least 20% thicker (more preferably at least 40% thicker) than the first IR reflecting layer.

In the coated article of any of the preceding nine paragraphs, the second IR reflecting layer may physically thicker than the first IR reflecting layer by at least 50 angstroms (Å), more preferably by at least 100 Å, and sometimes by at least 150 Å.

In the coated article of any of the preceding ten paragraphs, the first and/or second IR reflecting layer may consist essentially of the nitride of titanium.

In the coated article of any of the preceding eleven paragraphs, the coating may further comprise an overcoat comprising an oxide of zirconium.

In the coated article of any of the preceding twelve paragraphs, the glass substrate may be a clear or grey glass substrate.

In the coated article of any of the preceding thirteen paragraphs, the coated article measured monolithically may have a glass side reflective a* value of from −8 to +1.5, and/or a film side reflective a* value of from −8 to +1.5.

In the coated article of any of the preceding fourteen paragraphs, the coated article may have a visible transmission from 15-60%, more preferably from 15-50%, and in certain embodiments from 15-36%.

In the coated article of any of the preceding fifteen paragraphs, the coated article may have a glass side reflective b* value of from −12 to +4, and/or a film side reflective b* value of from −20 to +9.

In the coated article of any of the preceding sixteen paragraphs, the coating may consist essentially of the first, second and third dielectric layers comprising silicon nitride and the first and second IR reflecting layers, and may optionally comprise an overcoat comprising an oxide of zirconium.

In the coated article of any of the preceding seventeen paragraphs, one or more of the first, second, and third dielectric layers comprising silicon nitride may further comprise oxygen and/or may be doped with aluminum.

In the coated article of any of the preceding eighteen paragraphs, the coated article may be thermally tempered or simply annealed and not heat treated.

In the coated article of any of the preceding nineteen paragraphs, the coated article may be a monolithic window.

In the coated article of any of the preceding twenty paragraphs, the coated article measured monolithically may have one or more of an SHGC value of no greater than 0.52, a normal emittance ($E_n$) of no greater than 0.50, and an LSG of at least 0.70.

In the coated article of any of the preceding twenty one paragraphs, the coated article measured monolithically may have an SHGC value of no greater than 0.25, a normal emittance ($E_n$) of no greater than 0.28, and an LSG of at least 0.70.

In the coated article of any of the preceding twenty two paragraphs, the coated article measured monolithically may have an LSG of at least 1.00.

In the coated article of any of the preceding twenty three paragraphs, the second dielectric layer comprising silicon nitride may be at least 50 Å (more preferably at least 100 Å, and sometimes at least 300 Å) thicker than the first dielectric layer comprising silicon nitride.

In the coated article of any of the preceding twenty four paragraphs, the first IR reflecting layer may directly contact the first dielectric layer.

In the coated article of any of the preceding twenty five paragraphs, the second IR reflecting layer may direct contact each of the second and third dielectric layers comprising silicon nitride.

In the coated article of any of the preceding twenty six paragraphs, the first IR reflecting layer may be from about 5-400 Å thick (more preferably from about 140-300 Å thick), and/or the second IR reflecting layer comprising the nitride of titanium may be from about 50-450 Å thick (more preferably from about 200-400 Å thick).

Once given the above disclosure many other features, modifications and improvements will become apparent to the skilled artisan. Such other features, modifications and improvements are therefore considered to be a part of this invention, the scope of which is to be determined by the following claims:

What is claimed is:

1. A coated article including a coating supported by a glass substrate, the coating comprising:
    a first dielectric layer comprising silicon nitride;
    a first infrared (IR) reflecting layer comprising a nitride of titanium on the glass substrate over at least the first dielectric layer comprising silicon nitride;
    a second dielectric layer comprising silicon nitride on the glass substrate over at least the first dielectric layer comprising silicon nitride and the first IR reflecting layer comprising the nitride of titanium;

a second layer IR reflecting layer comprising a nitride of titanium on the glass substrate over at least the second dielectric layer comprising silicon nitride;

wherein the second dielectric layer comprising silicon nitride is located between and directly contacting the first and second IR reflecting layers comprising nitride of titanium;

a third dielectric layer comprising silicon nitride on the glass substrate over at least the second IR reflecting layer comprising the nitride of titanium;

wherein the coating contains no IR reflecting layer based on silver, and contains only two IR reflecting layers; and wherein the coated article measured monolithically has: a visible transmission from about 12-70%, a glass side visible reflectance no greater than 14%, and a glass side reflective a* value of from −10 to +1.6.

2. The coated article of claim 1, wherein the coating contains only two IR reflecting layers.

3. The coated article of claim 1, wherein the second dielectric layer comprising silicon nitride is located between and directly contacting the first and second IR reflecting layers.

4. The coated article of claim 1, wherein the second IR reflecting layer comprising the nitride of titanium comprises $TiN_x$, where x is from 0.8 to 1.2.

5. The coated article of claim 1, wherein the second IR reflecting layer comprising the nitride of titanium comprises $TiN_x$, where x is from 0.9 to 1.1.

6. The coated article of claim 1, wherein each of the first and second IR reflecting layers comprise $TiN_x$, where x is from 0.8 to 1.2.

7. The coated article of claim 1, wherein each of the first and second IR reflecting layers comprise $TiN_x$, where x is from 0.9 to 1.1.

8. The coated article of claim 1, wherein the first IR reflecting layer contains from 0-8% oxygen (atomic %).

9. The coated article of claim 1, wherein the first IR reflecting layer contains from 0-5% oxygen (atomic %).

10. The coated article of claim 1, wherein the second IR reflecting layer contains from 0-8% oxygen (atomic %).

11. The coated article of claim 1, wherein the second IR reflecting layer contains from 0-5% oxygen (atomic %).

12. The coated article of claim 1, where each of the first and second IR reflecting layers comprise from 0-5% oxygen (atomic %).

13. The coated article of claim 1, wherein the coated article measured monolithically has a film side visible reflectance no greater than about 16%.

14. The coated article of claim 13, wherein measured monolithically the coated article has a film side reflective a* color value of from −8 to +1.6.

15. The coated article of claim 14, wherein the second IR reflecting layer is at least 20% thicker than the first IR reflecting layer.

16. The coated article of claim 14, wherein the second IR reflecting layer is at least 40% thicker than the first IR reflecting layer.

17. The coated article of claim 1, wherein the second IR reflecting layer is physically thicker than the first IR reflecting layer by at least 50 angstroms (Å).

18. The coated article of claim 1, wherein the second IR reflecting layer is physically thicker than the first IR reflecting layer by at least 100 Å.

19. The coated article of claim 1, wherein the second IR reflecting layer is physically thicker than the first IR reflecting layer by at least 150 Å.

20. The coated article of claim 1, where the second IR reflecting layer consists essentially of the nitride of titanium.

21. The coated article of claim 1, wherein the coating further comprises an overcoat comprising an oxide of zirconium.

22. The coated article of claim 1, wherein the glass substrate is a clear glass substrate.

23. The coated article of claim 1, wherein the coated article measured monolithically has a glass side reflective a* value of from −8 to +1.5, and a film side reflective a* value of from −8 to +1.5.

24. The coated article of claim 1, wherein the coated article has a visible transmission from 15-36%.

25. The coated article of claim 1, wherein the coated article has a glass side reflective b* value of from −12 to +4, and a film side reflective b* value of from −20 to +9.

26. The coated article of claim 1, wherein the coating consists essentially of the first, second and third dielectric layers comprising silicon nitride and the first and second IR reflecting layers, and may optionally comprise an overcoat comprising an oxide of zirconium.

27. The coated article of claim 1, wherein one or more of the first, second, and third dielectric layers comprising silicon nitride further comprises oxygen and is doped with aluminum.

28. The coated article of claim 1, wherein the coated article is thermally tempered.

29. The coated article of claim 1, wherein the coated article is a monolithic window.

30. The coated article of claim 1, wherein the coated article measured monolithically has an SHGC value of no greater than 0.52, a normal emittance ($E_n$) of no greater than 0.50, and an LSG of at least 0.70.

31. The coated article of claim 1, wherein the coated article measured monolithically has an SHGC value of no greater than 0 25, a normal emittance ($E_n$) of no greater than 0.28, and an LSG of at least 0.70.

32. The coated article of claim 1, wherein the coated article measured monolithically has an LSG of at least 1.00.

33. The coated article of claim 1, wherein the second dielectric layer comprising silicon nitride is at least 100 Å thicker than the first dielectric layer comprising silicon nitride.

34. The coated article of claim 1, wherein the first IR reflecting layer directly contacts the first dielectric layer.

35. The coated article of claim 1, wherein the first IR reflecting layer is from about 140-300 Å thick, and the second IR reflecting layer comprising the nitride of titanium is from about 200-400 Å thick.

36. A coated article including a coating supported by a glass substrate, the coating comprising:
    a first dielectric layer comprising silicon nitride;
    a first infrared (IR) reflecting layer comprising a nitride of titanium on the glass substrate over at least the first dielectric layer comprising silicon nitride;
    a second dielectric layer comprising silicon nitride on the glass substrate over at least the first dielectric layer comprising silicon nitride and the first IR reflecting layer comprising the nitride of titanium;
    a second layer IR reflecting layer comprising a nitride of titanium on the glass substrate over at least the second dielectric layer comprising silicon nitride;
    wherein the second dielectric layer comprising silicon nitride is located between and directly contacting the first and second IR reflecting layers comprising nitride of titanium;

a third dielectric layer comprising silicon nitride on the glass substrate over at least the second IR reflecting layer comprising the nitride of titanium;

wherein the coating contains no IR reflecting layer based on silver, and contains only two IR reflecting layers; and wherein the coated article measured monolithically has a visible transmission from about 12-70% and one or more of: (a) a glass side visible reflectance no greater than about 16%, (b) a glass side reflective a* value of from −10 to +1.6, (c) a film side visible reflectance no greater than about 16%, and (d) a film side reflective a* color value of from −8 to +1.6.

37. The coated article of claim 36, wherein the second IR reflecting layer is at least 20% thicker than the first IR reflecting layer.

38. The coated article of claim 36, wherein the second IR reflecting layer is at least 40% thicker than the first IR reflecting layer.

* * * * *